United States Patent [19]

Sanderson

[11] 3,789,313

[45] Jan. 29, 1974

[54] ACTIVE FILTER CIRCUITS

[75] Inventor: Albert E. Sanderson, Carlisle, Mass.

[73] Assignee: Inventronics, Inc., Carlisle, Mass.

[22] Filed: May 23, 1972

[21] Appl. No.: 256,178

[52] U.S. Cl. .................................. 330/107, 330/109

[51] Int. Cl. .............................................. H03f 1/36

[58] Field of Search ............... 330/21, 31, 107, 109; 333/70 R

[56] References Cited

OTHER PUBLICATIONS

Girling et al., "Active Filters," Wireless World, December 1969, pp. 568–572.

Esteban et al., "High Q Active Filter," IBM Technical Disclosure Bulletin, May 1971, pp. 3,586–3,589.

Aikens, "Cut Butterworth Filter Phase Distortion," Electronic Design 24, Nov. 22, 1969, pp. 74–77.

Tow, "A Step-By-Step Active-Filter Design," IEEE Spectrum, December 1969, pp. 64–68.

Sun, "Low Sensitivity Active RC Filters For Low Frequency Integrated Circuits," Proceedings of the 13 Midwest Symposium on Circuit Theory, 7–8 May 1970, pp. VI 1.1–VI 1.6.

Minuskin, "Active Filter Design Uses Basic Language," Electronic Design, Mar. 1, 1970, pp. 83, 85.

*Primary Examiner*—Herman Karl Saalbach
*Assistant Examiner*—James B. Mullins
*Attorney, Agent, or Firm*—Cesari and McKenna

[57] ABSTRACT

A family of active filter circuits. Each filter has two time constant networks with each network having an element in one loop of a multi-loop feedback circuit for an amplifier. A generalized transfer function $$e_o/e_{in} = \frac{as^2 + bs + c}{(A+1)T1T2\, s^2 + [(A+1)T1 + T2]s + (A+1)}$$

describes the operation of each active filter. In this function, A is amplifier gain and T1 and T2 are time constants for the two time constant networks. Some specific circuits have a transfer function in which the coefficients "a" and "c" are 0 and operate as band-pass filters. In these circuits, amplifier gain variations do not affect the resonant frequency, while the resonant frequency can be changed by altering the time constant networks without affecting the quality factor or gain at resonance.

14 Claims, 11 Drawing Figures

ACTIVE FILTER CIRCUITS

BACKGROUND OF THE INVENTION

This invention generally relates to filter circuits and more specifically to a family of active filters.

In recent years, active filters have become very popular. Generally, they comprise resistors, reactive impedance elements (usually capacitors) and one or more amplifiers to provide internal filter gain. Their popularity stems from the fact that many prior, passive circuits require expensive and physically large components to duplicate the filter characteristics achieved by small, relatively inexpensive active filter components. The popularity of these filters can be more readily appreciated by viewing the large number of active filters which have been proposed. Usually, each filter has a particular application, such as a band-pass filter, a high- or low-pass filter or an oscillator application.

One way to analyze a filter circuit is to determine its "transfer function" which uniquely defines the ratio of the output signal to the input signal for the circuit in terms of its component values and amplifier gains. Any circuit modification, however slight, may alter the transfer function to a degree impossible to predict without recalculating the transfer function.

Prior filters are designed with certain properties or characteristics in mind. For example, in a band-pass filter, the quality factor (Q) and resonant frequency ($\omega_o$) are important characteristics. In some active filter circuits, resistances, capacitances and amplifier gain all affect both the resonant frequency and the quality factor.

Another band-pass filter includes two cascaded amplifiers coupled by a high-pass filter. A resistor couples an input signal to the first amplifier. A capacitor between the output of the second amplifier and the input of the first amplifier provides feedback. Each resistor and capacitor and the gain of each amplifier affects the resonant frequency and the quality factor. Although one filter is built so changes in the passive elements do not affect the quality factor, the resonant frequency and quality factor are not mutually independent. If the gain of one amplifier changes, as is necessary to effect a change in quality factor, there is an undesirable interaction that alters the resonant frequency as well.

Stability is another important characteristic. The band-pass filters described above, while not having mutually independent quality factors and resonant frequencies, are relatively stable. Prior circuits which do provide independent control of quality factor and resonant frequency tend to be unstable. That is, their quality factors are highly sensitive to small changes in the values of individual tuning elements. A 10% change in the value of a single capacitor may, in some circuits, cause a 100% change in the quality factor. If gain is sufficiently high, this could cause a band-pass or other filter circuit to oscillate.

Therefore, it is an object of this invention to provide a family of filters with a basic transfer function.

It is another object of this invention to provide a family of active filters in which changes in amplifier gain and resonant frequency are substantially mutually independent.

Another object of this invention is to provide a family of filters in which one member is a band-pass filter in which changes in resonant frequency and quality factor can be made independently of each other.

Another object of this invention is to provide a family of filters in which one member is a high-pass filter.

Another object of this invention is to provide a family of filters in which one member is a low-pass filter.

Another object of this invention is to provide a family of filters in which one member is a notch filter.

Another object of this invention is to provide a family of filters in which one member is an oscillator.

SUMMARY

In accordance with my invention, I have found that the following generalized transfer function describes a family of active filters circuits:

$$e_o/e_{in} = as^2 + bs + c/(A+1)T1T2s^2 + [(A+1)T1+T2]s + (A+1)$$

where $a$, $b$, and $c$ are coefficients that depend in a specific configuration, T1 and T2 are time constants for time constant networks, A is amplifier gain and $s$ is an operator $j\omega$, $\omega$ being the operating angular frequency.

This invention is pointed out with particularity in the appended claims. A more thorough understanding of the above and further objects and advantages of this invention may be attained by referring to the following description taken in conjunction with the accompanying drawings.

DESCRIPTION OF ILLUSTRATIVE EMBODIMENTS

In accordance with my invention, I have found a family of active filters that operate in accordance with the following generalized transfer function:

$$e_o/e_{in} = as^2 + bs + c/(A+1)T1T2s^2 + [(A+1)T1+T2]s + (A+1) \qquad (1)$$

In this transfer function A is the gain of an amplifier circuit; T1 and T2 are time constants for time constant networks; $s = j\omega$ where $\omega$ is an operating angular frequency and $a$, $b$ and $c$ are circuit coefficients defined by a particular filter configuration.

Generally, the circuits which conform a specific set of coefficient values have interesting characteristics. For example, I have found that if $a = c = 0$ and $b = -KAT2$, the circuit is a band-pass filter with highly desirable characteristics. Its resonant frequency depends only upon the elements in the time constant networks T1 and T2. Amplifier gain and resonant frequency are not interactive. If a certain relationship of the passive elements, discussed later, is maintained, the quality factor and values of the passive elements are not interactive. That is, you can alter the passive elements to change the resonant frequency without any Q changes. Furthermore, the filter circuit is essentially insensitive to variations to the value of any single circuit element and is, therefore, very stable even at high values of quality factor.

Figure 1:
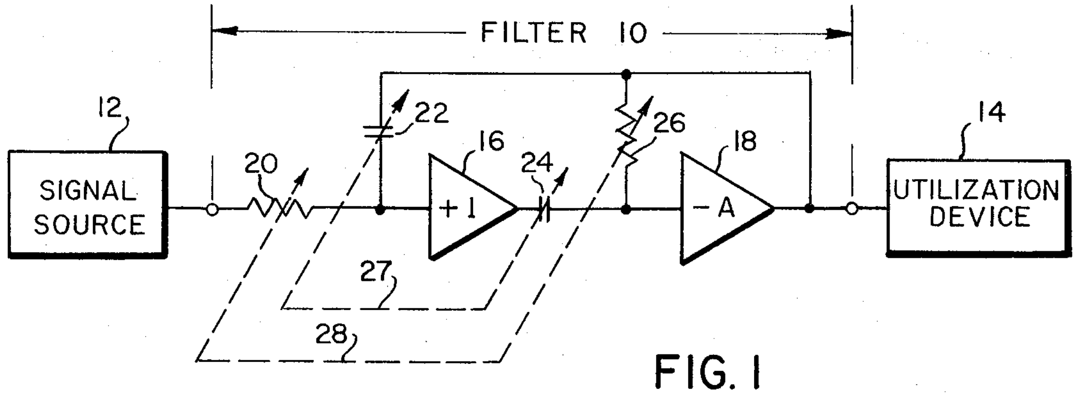
FIG. 1 is a schematic diagram of a band-pass filter circuit constructed in accordance with my invention.

In FIG. 1, a filter 10 connects a signal source 12 to a utilization device 14. It comprises a unity gain isolating amplifier 16 and an inverting amplifier 18. Both amplifiers are assumed to have essentially infinite input impedance and zero output impedance. A first time constant network comprises a resistor 20 and a capacitor 22 between the signal source 12 and the unity gain amplifier 16. A second time constant network comprises a capacitor 24 and resistor 26 and is interposed between the output terminal of the amplifier 16, which also constitutes a zero impedance connection to ground due to the zero output impedance of the amplifier 16, and the input terminal of the amplifier 18. There are two negative feedback paths. One path includes the capacitor 22, while the other path includes the resistor 26, so each path contains one element in a respective time constant network.

The filter 10 in FIG. 1 acts as a band-pass filter. Specifically, with a direct current input, both capacitors 22 and 24 are effectively open circuits so the output voltage is zero. At very high frequencies, capacitors are short circuits, so the negative feedback through the capacitor 22 provides a zero output. At intermediate frequencies, there is some finite output voltage. These are the characteristics of a band-pass filter.

An analysis of FIG. 1 shows that the transfer function is:

$$e_o/e_{in} = -AT2s/(A+1)T1T2s^2 + [(A+1)T1+T2]s + (A+1) \quad (2)$$

where $T1 = R_{20}C_{22}$ and $T2 = R_{26}C_{24}$. Differentiating equation (2) with respect to $s$, and setting the result to zero provides the resonant frequency which is:

$$\omega_o = \sqrt{1/T1T2} \quad (3)$$

The resonant frequency is then solely dependent upon the values of the resistors 20 and 26 and the capacitors 22 and 24. Any variation in the gain A of amplifier 18 does not affect the resonant frequency because "A" does not appear in equation (3). As equation (3) does not depend on any assumptions being made about the values of circuit elements or operating conditions, wide gain changes can be made to vary the quality factor without altering the resonant frequency.

Further analysis of FIG. 1 shows that quality factor Q is given by $$Q = 1/\sqrt{T1/T2} + [1/(A+1)][\sqrt{T2/T1}] \quad (4)$$

This equation shows that the elements in the time constant networks and the gain both affect the quality factor. However, if equation (4) is partially differentiated with respect to the logarithm value (ln) of each impedance element to analyze the response of the quality factor to a change in that element, it is found that $$d(\ln Q)/d(\ln C_{22}) = ½ - 1/1+[T2/(A+1)T1] \quad (5)$$

$$d(\ln Q)/d(\ln R_{26}) = d(\ln Q)/d(\ln C_{24}) = ½ - 1/1+[(A+1)T1/T2] \quad (6)$$

Both equations (5) and (6) indicate the quality factor is insensitive to any change in a single element in either time constant network if $$T2 = (A+1)T1 \quad (7)$$

In other words, so long as the time constant T2, for capacitor 24 and resistor 26, is nominally equal to $(A+1)$ times the time constant T1, for resistor 20 and the capacitor 22, the quality factor is insensitive to small variations of the values of individual elements in the time constant networks. This means the filter quality factor is very stable. Furthermore, it is relatively easy to change the resonant frequency and yet maintain this relationship for large variations of the elements by ganging the capacitors 22 and 24 or the resistors 20 and 26 as shown by dashed lines 27 and 28, respectively in FIG. 1.

There are, then, three design formulae for selecting circuit elements to satisfy equation (7) for a specific application, given the quality factor and resonant frequency. They are $$A = 4Q^2-1 \quad (8)$$

$$T1 = 1/2Q\omega_o \quad (9)$$

$$T2 = 2Q/\omega_o \quad (10)$$

Equation (8) provides the gain for the amplifier 18; equation (9), the time constant for the first time constant network comprising resistor 20 and capacitor 22; equation (10), the time constant for the other network comprising capacitor 24 and resistor 26.

As these equations indicate, only the total time constants are critical. There is no need to match individual capacitors or resistors. This feature simplifies the filter even though the two time constants are in a ratio equal to the gain $A+1$. It is possible, with this circuit, to select the most economical combination of resistors and capacitors to achieve the required time constants.

The lack of significant assumptions in the foregoing analysis means that the filter circuit 10 in FIG. 1 can be tuned to low frequencies, including those in the audio and sub-audio range without losing any of the foregoing advantages.

When transfer functions for prior active filter circuits are solved for resonant frequency, an equation analogous to equation (3) shows that the resonant frequency varies as the reciprocal of the square root of gain. (i.e., $\omega_o = k/\sqrt{A+1}$ Hence, prior circuits are limited to very small gain variations, usually "trimming" operations.

In any practical circuit, an amplifier, such as the amplifier 18, has some inherent phase shift. The filter circuit 10 can compensate for this phase shift quite easily.

If $T_A$ represents the time constant for the amplifier 18 having a compensated unity-gain angular frequency of $\omega 1$, then $T_A = 1/\omega 1$. If the term $A/(1+AT_As)$ is substituted for A in equation (2) to simulate the finite bandwidth of the amplifier, the sensitivities of resonant angular frequency ($\omega_o$) and the quality factor Q to amplifier phase shift are given by $$d(\ln Q)/d(\ln A) = -d(\ln \omega_o)/d(\ln A) = Q\omega_o/\omega_1 \quad (11)$$

In prior circuits, these sensitivities to phase shift are significantly higher and limit quality factor. Since quality factor depends on amplifier phase shift, the amplifier bandwidth ($\omega 1$) must be large compared to the product of the quality factor and resonant frequency (i.e., $Q\omega_0$). Otherwise the quality factor for a given circuit changes significantly with changes of resonant frequency. My filter circuit 10 reduces the bandwidth requirements by up to a factor of $4Q^2$ over those necessary in prior filters.

Prior filters are also prone to tuning errors. The sensitivity of the resonant frequency to the amplifier time constant produces a tuning error linearly increasing with frequency. The sensitivity equation for these prior circuits is analogous to equation (11), except the sensitivity of the filter 10 is about half the sensitivity of the prior filters. Furthermore, the mutual independence of the quality factor and resonant frequency enable a simple modification to eliminate tuning errors in the filter circuit 10. It is merely necessary to reduce the value of the time-constant network comprising capacitor 24 and resistor 26 by an amount equal to the amplifier time constant $T_A$. As the time constant introduced by the capacitor 24 and resistor 26, and the time constant introduced by the amplifier 18 are additive, the reduction in the time constant network offsets the time constant of amplifier 18 so overall filter operation does not change.

Figure 2:
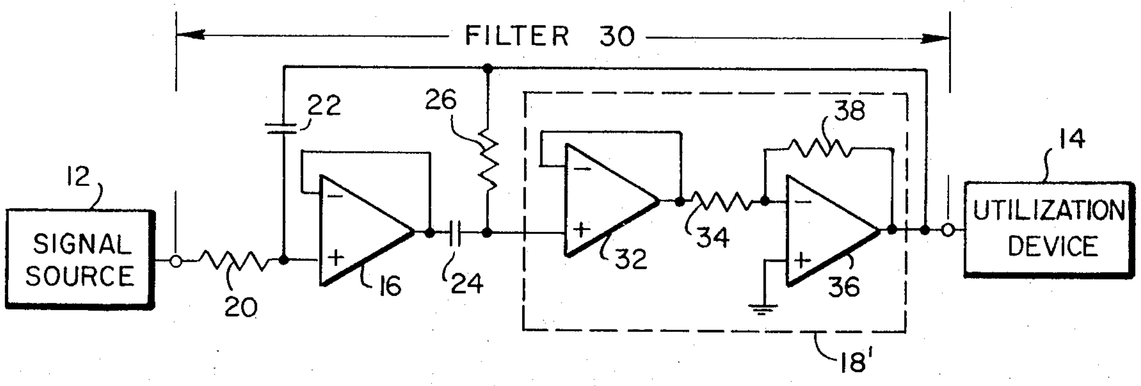
FIG. 2 is alternative embodiment of a band-pass filter.

Hence, the filter 10 in FIG. 1 provides a tunable, variable-Q filter with non-interacting controls for both the resonant frequency and the quality factor. However, gain must be increased to get higher quality factors. This gain can be supplied most easily by an "operational amplifier." A filter 30 in FIG. 2 provides higher quality factors than the circuit in FIG. 1. This circuit is substantially the same as the circuit in FIG. 1 with like numerals being used to designate like elements. The primary modification resides in the nature of an amplifer 18', which is substituted for the amplifier 18 in FIG. 1. As specifically shown in FIG. 2, the amplifier circuit 18' comprises a unity-gain amplifier 32 which receives the incoming signal and couples its output through the resistor 34 to an inverting amplifier 36. The ratio of the value of a negative feedback resistor 38 to the value of the resistor 34 controls the overall gain of the amplifier circuit 18'.

Analysis of the schematic itself enables one to predict that only terms involving amplifier gain should change. Furthermore, the gain of the amplifier circuit 18' is the product of the gains for the amplifier 32 and the amplifier 36. The latter gain is determined by the ratio of the resistors R38 and R34 so that $A = R_{38}/R_{34}$.

An analysis of the circuit in FIG. 2 confirms this fact. The transfer function for FIG. 2 is the same as equation (2) with $A = R_{38}/R_{34}$.

Figure 3:
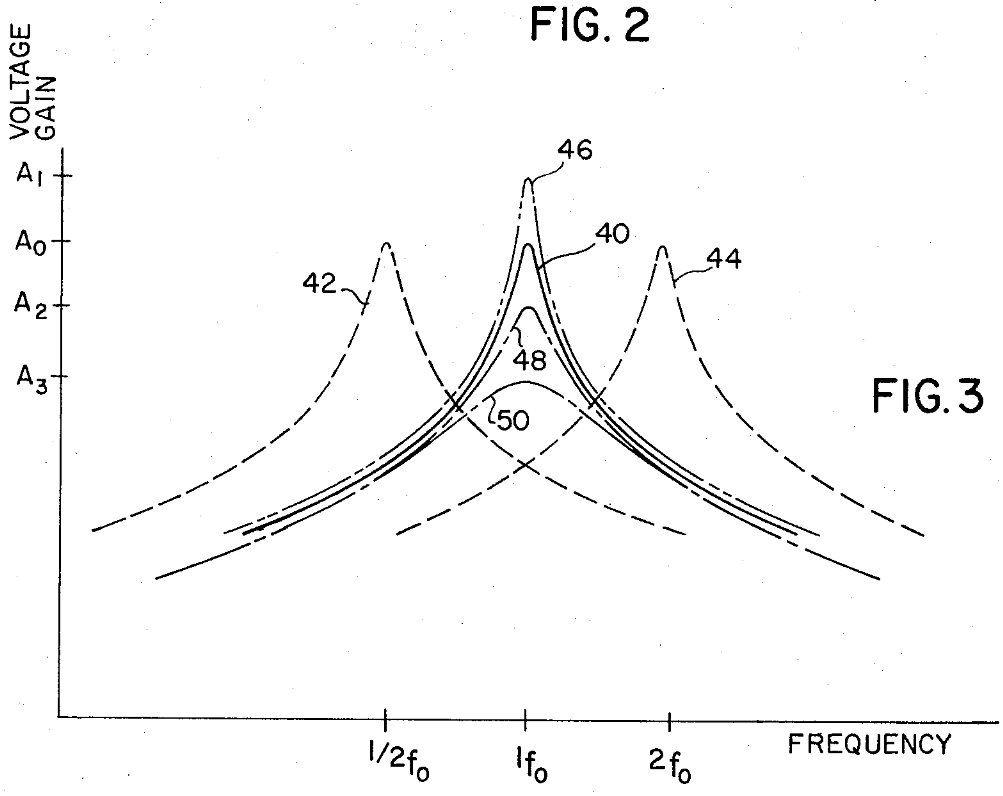
FIG. 3 is a graphical analysis of the operation of the filter circuit shown in FIG. 2.

FIG. 3 is a family of response curves for the filter circuit 30 in FIG. 2. Curve 40 is a base curve with a resonant frequency $f_0$, a reference quality factor $Q_0$ and a reference voltage gain $A_0$. If the values of the capacitors 22 and 24 are doubled, the resonant frequency drops to half its original value (i.e., to $0.5f_0$ as shown in curve 42). If the values of the capacitors 22 and 24 are halved, the resonant frequency is twice its original frequency (i.e., $2f_0$) as shown by curve 44. If the resistors 38 and 34 in amplifier 18' do not change, the overall gain $A_0$ and quality factor for the filter 30 also remain constant during these capacitor value variations.

On the other hand, if the values of the capacitors 22 and 24 remain constant, then increasing the value of the resistor 38 increases the overall gain of the circuit to A1 as shown by curve 46. There is also a corresponding increase in the quality factor. Reducing the value of the resistor 38 lowers the gain to successively lower overall values A2 and A3 (curves 48 and 50, respectively). There is an accompanying drop in quality factor. However, these changes affect only the quality factor and gain at resonance; the resonant frequency does not change.

Consider a specific example wherein amplifiers 16, 32 and 36 are type 741 operational amplifiers manufactured by Fairchild Camera and Instrument Corporation and the other components include:

Resistor 20 = 200 ohms
Resistor 34 = 100 ohms
Resistor 26 = 320 kilohms
Capacitor 22=Capacitor 24=0.02$\mu$fd
Resistor 38 = 58 kilohms This filter has a resonant frequency of 1,000 Hz and a quality factor of 10. Switching the capacitors 22 and 24 to values of 0.04 $\mu$fd shifts $f_0$ to 500 Hz, while capacitors of 0.01 $\mu$fd produce a resonant frequency of 2,000 Hz. At each frequency the quality factor remains equal to 10 ($Q$=10). If the capacitors 22 and 24 are 0.02 $\mu$fd capacitors, curve 46 represents a filter circuit with a quality factor of 20. This characteristic quality factor occurs when resistor 38 is increased to 300 kilohms. Reducing the resistor 38 to 23 kilohms and 8.2 kilohms produces curves 48 and 50 which represent quality factors of 5 and 2 respectively.

Figure 4:
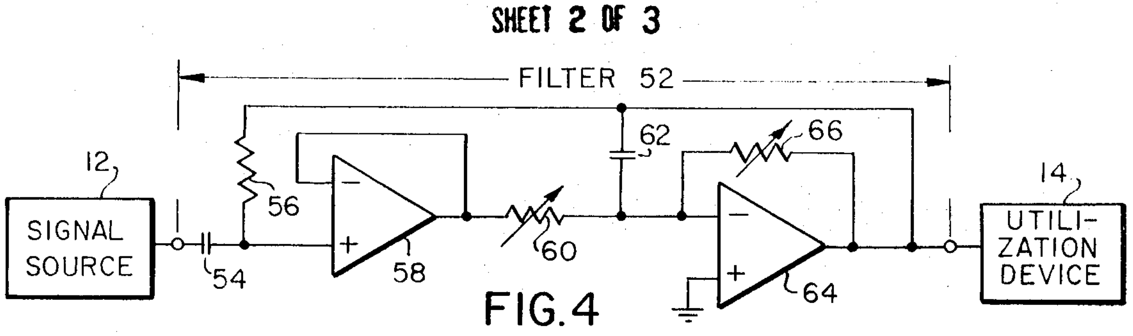
FIG. 4 is another band-pass filter constructed in accordance with my invention.

The filter circuits 10 and 30 in FIGS. 1 and 2 are particularly useful when resonant frequency and quality factor are the desired independent variables. FIG. 4, on the other hand, shows a simple filter circuit 52 in which resonant frequency and bandwidth can be independently controlled. This circuit also operates in accordance with equation (1).

In FIG. 4, a signal source 12 energizes the filter 52 through a capacitor 54 which is one element in a first time constant network additionally comprising a feedback resistor 56 connected to the output terminal. The capacitor 54 also couples the incoming signal to the non-inverting input of a unity-gain amplifier 58. A resistor 60 and a feedback capacitor 62 constitute a second time constant network between the output of the amplifier 58 and the inverting input of amplifier 64. A resistor 66 provides negative feedback for the amplifier 64 and, with the resistor 60, controls gain.

A qualitative analysis of FIG. 4 shows that the positions of the capacitors and resistors in each time constant network are interchanged. In FIG. 2, the resistor 20 and capacitor 22 operate as a low-pass filter; the capacitor 54 and resistor 56 act as a high-pass filter in FIG. 4. Similarly, while capacitor 24 and resistor 26 of FIG. 2 act as a high-pass filter, input to the amplifier 18, the resistor 60 and capacitor 62 in FIG. 4 act as a low-pass filter input. If $T_L$ (a low-pass filter time constant) is substituted for $T_1$ in equation (2) and $T_H$ (a high-pass filter time constant) for $T_2$, then equation (2) defines the operation of the circuit in FIG. 4 with A = R66/R60. Both resistors 60 and 66 interact with the capacitor 62, so the resultant time constant $T_L$ is the product of the values of capacitor 62 and the parallel resistors 60 and 66. So $T2 = T_L = C62\,[R_{60}R_{66}/(R_{60}+R_{66})]$. By inspection, it can be seen that FIG. 4 is a band pass filter with the same characteristics as the filters in FIGS. 1 and 2. If the transfer function is recalculated, it is:

$$e_o/e_{in} = -AT1s/(A+1)\quad T1T2s^2 + [(A+1)\ T2 + T1]s + (A+1) \qquad (12)$$

where $A = R_{66}/R_{60}$, $T_1 = R_{56}C_{54}$ and $T_2 = C_{62}[R_{60}R_{66}/(R_{60}+R_{66})]$.

A further analysis of equation (12) shows that the resonant frequency, the quality factor and bandwidth (bw) are:

$$\omega_0 = \sqrt{1+(R_{60}/R_{66})/R_{56}C_{54}R_{60}C_{62}} \qquad (13)$$

$$Q = \sqrt{1+(R_{60}/R_{66})}/\sqrt{(R_{60}C_{62}/R_{56}C_{54})} + (R_{60}/R_{66})\sqrt{R_{56}C_{54}/R_{60}C_{62}} \qquad (14)$$

$$bw = 1/R_{56}C_{54} + R_{60}+R_{66}/(R_{66})^2C_{62} \qquad (15)$$

Furthermore, the partial differentiations of the quality factor with respect to the values of the resistor 56 and capacitors 54 and 62 show that the quality factor is not affected by small changes in the values of these components so long as $$R_{56}C_{54} = R_{66}C_{62} \qquad (16)$$

If this relationship is maintained, then equations (13) and (14) provide the following relationships which are analogous to equations (8), (9) and (10):

$$R_{66}/R_{60} = 4Q^2-1 \qquad (17)$$

$$R_{56}C_{54} = 2Q/\omega_0 \qquad (18)$$

$$R_{60}C_{62} = 1/[2Q\omega_0(1-1/4Q^2)] \qquad (19)$$

The analogy is based upon the fact that the resistor 66 is normally quite large in comparison with resistor 60. While the resistor 66 varies the quality factor, bandwidth, and gain, there is substantially no interaction with the elements which determine the resonant frequency. On the other hand, resistor 60 alters the resonant frequency with substantially no affect upon the bandwidth or gain at resonance.

Filter circuit 52 in FIG. 4 can provide quality factors in excess of 200. One such filter operates with a $Q$=250 and $f_0$=400 Hz. Furthermore, wide ranges of resonant frequency variations (usually step-wise changes) can be made by switching the capacitors 54 and 62.

The circuits in FIGS. 1, 2 and 4 are low input impedance filters, such as signal sources with low or essentially zero output impedance. Hence, the connection of resistors 20 in FIGS. 1 and 2 and the capacitor 54 in FIG. 4 to such a signal source 12 is also a zero impedance connection to ground. They can not be driven by a high-level signal. The modified circuit in FIG. 5, however, can receive such high-level signals. It can also operate with an overall unity gain. This is desirable in some applications, such as a cascaded filter example described later.

Figure 5:
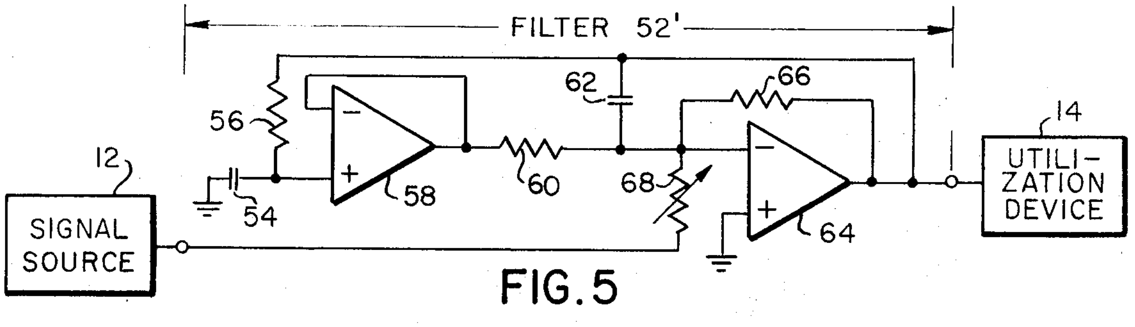
FIG. 5 is still another band-pass filter adapted for use with a source of high-level input signals.

The circuit shown in FIG. 5 is similar to that shown in FIG. 4 with two modifications. First, capacitor 54 is grounded directly. Secondly, the signal source 12 energizes the summing input of the amplifier 64 through a resistor 68. With this circuit, the resistors 66 and 68 control gain, so gain control merely requires that the resistor 68 be a variable resistor. If the value of resistor 68 changes, neither the resonant frequency nor the quality factor changes. As the filter input impedance is equal the resistance of the resistor 68, the input impedance is significantly higher than when the signal source 12 feeds either the capacitor 54 or the resistor 20 in the previously described circuits. Hence, the signal source 12 may have a relatively high output impedance.

If T1 is the time constant for the network comprising the capacitor 54, then $T_1s>>1$ near resonance for reasonable values of quality factor. If this relationship is incorporated in the transfer function analysis, the circuit in FIG. 5 has a transfer function which is basically the same as that in equation (2). The exact function is:

$$\frac{e_o}{e_{in}} = \frac{-\frac{R_{66}}{R_{68}}(1+T1s)}{(A+1)T1T2s^2+[(A+1)T2+1]s+(A+1)} \qquad (20)$$

Figure 6:
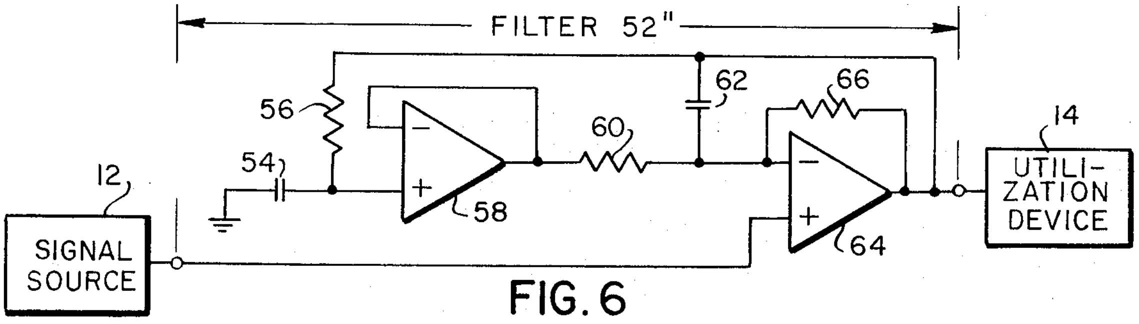
FIG. 6 is a band-pass filter adapted for use with a high impedance source.

FIG. 6 shows yet another modification of the circuit shown in FIG. 5 which provides an even higher input impedance. The signal source 12 energizes the positive input of the amplifier 64 directly. An analysis of this circuit shows that its transfer function is merely a slight modification of the preceding transfer function. In this case, the numerator contains an additional term (1+T2s). The general transfer function is:

$$e_o/e_{in} = -(A+1)\quad(1+T1s)\ (1+T2s)/(A+1)T1T2s^2+[(A+1)+T1]s+(A+1) \qquad (21)$$

However, at resonance $-1/T1T2=s^2$ so the product (1+T1s)(1+T2s) only has an "$s$" term. At operating frequencies near resonance, the "$s$" term is significantly larger than either "1" or the "$s^2$" term, so the transfer function is approximately:

$$e_o/e_{in} = -(A+1)(T1+T2)s/(A+1)T1T2s^2+[(A+1)T2+T1]s + (A+1) \qquad (22)$$

Hence, the transfer function states, and a circuit constructed in accordance with FIG. 6 proves, that the circuit operates substantially in accordance with the transfer function for FIG. 4 (equation (12) for operating quality factors greater than 5 (i.e., $Q>5$). This is a relatively low quality factor.

Figure 7:
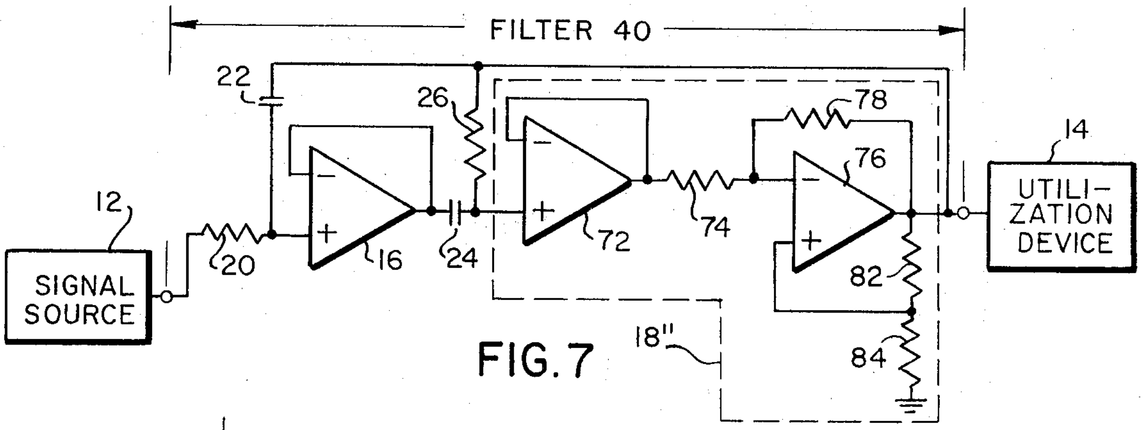
FIG. 7 is yet another band-pass filter.

Although these band-pass filters are capable of achieving quality factors with values up to several hundred, finite gain limits any easily achievable quality factor. FIG. 7 shows a band-pass filter with positive feedback which is stable with a quality factor of several thousand. This filter is substantially similar to the filter shown in FIG. 2, except for the amplifier 18. In FIG. 7, the equivalent amplifier 18'' comprises a unity gain amplifier 72, a coupling resistor 74 and an amplifier 76, which has both positive and negative feedback, a gain controlling resistor 78 and a positive feedback circuit with resistors 82 and 84. Resistors 82 and 84 form a voltage divider and the positive feedback it supplies increases the quality factor and the overall gain of the filter 40 significantly. Equation 2 is still valid if the gain is calculated in terms of the resistors 74, 78, 82 and 84, all which affect the amplifier gain. Specifically, the gain is $$A = R78(R82+R84)/R74R84 - R78R84 \quad (23)$$

As apparent from equation (23) it is realistically possible to have the difference value in the denominator approach zero, thereby providing an overall gain which approaches infinity. In fact, if the ratio of the resistors R82 to R84 is equal to the ratio of the resistors R74 to R78 (i.e. R82/R84 = R74/R78, then extremely high gains are realized.

Looking at this filter from another standpoint, it can be seen that the positive feedback connection multiplies the quality factor and overall gain of the filter circuit 40 by the factor $1/(1-G_o\beta)$ where $G_o\beta$ is the loop gain of the feedback loop at resonance, $G_o$ being the forward loop gain and $\beta$ being the feedback factor. For the filter in FIG. 7, $$\beta = R84/R82 + R84 \quad (24)$$

and $G_o$ is purely resistive at resonance. It is obvious that $\beta$ can be chosen to be any desired multiplier for the quality factor. If, for example, $\beta = 0.9G_o$, the addition of positive feedback multiplies the quality factor by 10. Furthermore, if the feedback factor were increased so $\beta G_o=1$, the circuit would oscillate in a stable manner. As the circuit has a high quality factor even without positive feedback, any such oscillations would be relatively free of harmonics and, therefore, highly sinusoidal. The oscillator configuration is easily obtained by merely grounding the input resistor 20 and adjusting the circuit values so that $G_o\beta=1$.

In each of the circuits described so far, a variation in the overall filter quality factor changes the overall filter gain. If the change is undesirable, a filter circuit in FIG. 8 minimizes it by modifying the amplifiers. Specifically, an amplifier 18''' replaces the previously described amplifier 18 and 18'. It contains two cascaded operational amplifiers 90 and 92 with the connecting point being coupled to the utilization device 14. The operational amplifiers have gains ±A1 and ∓A2, respectively, and so they are always of opposite sign or polarity. This circuit has the transfer function:

$$e_o/e_{in} = \pm A1 \; T2s/(A1A2+1)T1T2s^2+\lambda [(A1A2+1)T1+T2]s+(A1A2+1) \quad (25)$$

Varying the gain (A2) of the amplifier 92 alters the quality factor with a minimal effect on overall gain at resonance because the amplifier 92 has no effect on the numerator. In one specific filter, the overall gain at resonance varied by a factor of 2:1 for a 10:1 variation in quality factor. In prior circuits, a similar quality factor variation alters the overall gain by as much as 50:1.

Figure 8:
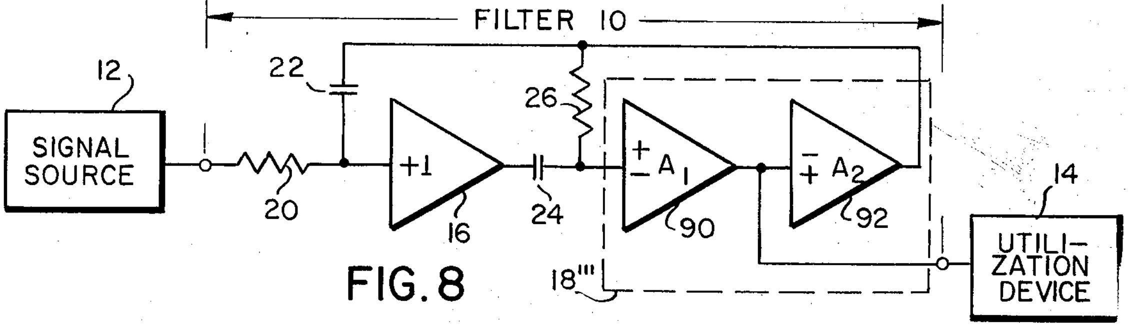
FIG. 8 is still another band-pass filter.

There are many modifications of the circuit shown in FIG. 8. For example, a high impedance signal source 12 could connect to the amplifier 92. If the resistor 20 were grounded, and the utilization device 14 were connected to the output of the amplifier 92, the amplifier 90 would control quality factor. As another example, the amplifier 92 may be replaced with a potentiometer if amplifier 90 is an inverting amplifier and has sufficient gain to supply the total gain required by the transfer function. In still another embodiment, a direct connector might replace the amplifier 16. This requires that the time constant network comprising the resistor 20 and capacitor 22 have a low impedance compared with the second time constant network comprising resistor 26 and capacitor 24.

Figure 9:
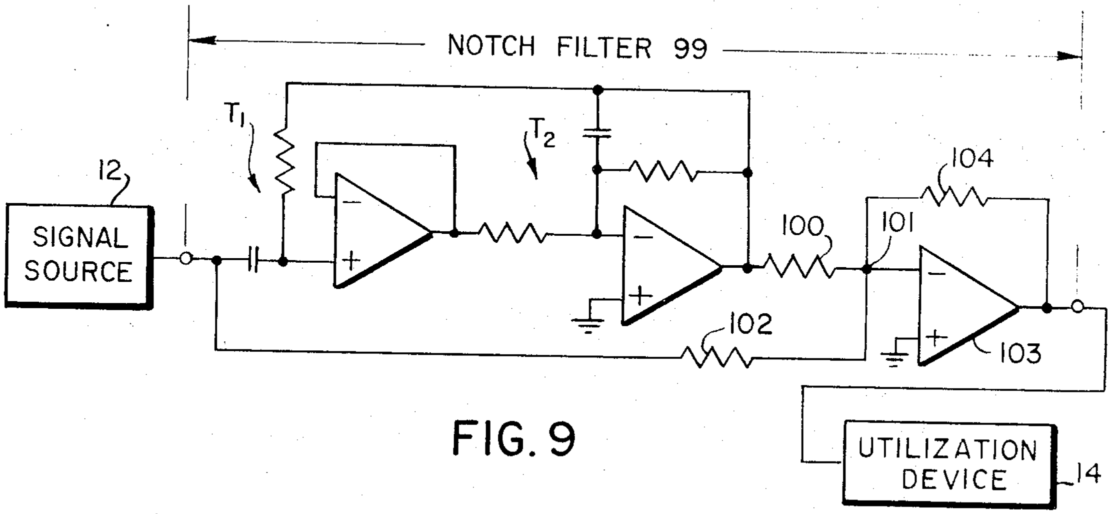
FIG. 9 is a notch filter constructed in accordance with my invention.

Notch and band-pass filters are related. Whereas, a band-pass filter passes a narrow band of frequencies, a notch filter rejects a narrow band of frequencies. Basically, this is accomplished by subtracting a band-pass filter output from unfiltered signal so as to cancel the signal at the resonant frequency of the filter. Such a notch filter 99 is shown in FIG. 9 and uses a band-pass filter analogous to the filter shown in FIG. 4.

The band-pass filter itself couples a narrow band of frequencies from the signal source 12 through a resistor 100 to a summing junction 101. The signal itself is coupled directly to the summing junction 101 from the signal source 12 by means of a resistor 102. At resonance, the filter produces a 180° phase shift. As a result, the summing junction 101 receives two signals with 180° phase difference so they subtract. An inverting amplifier 103 with a negative feedback resistor 104 couples the resultant summed signal to the utilization device 14. If one of the resistors 100 and 102 is variable, then the two components can be altered in magnitude so the output signal to the utilization device 14 goes to zero at the resonant frequency for the filter. As the frequency of the signal from the source 12 deviates from the resonant frequency, the output from the filter circuit declines nearly to zero and the overall gain from the signal source 12 to the utilization device 14 is equal to the ratio of the resistor 104 to the resistor 102, the filter circuit itself being effectively removed from the circuit. An analysis of this circuit shows that transfer function is:

$$e_o/e_{in} = \frac{R104/R100 \; AT2s}{(A+1)T1T2s^2+[(A+1)T2+T1]s+(A+1)} - R104/R102 \quad (26)$$

The basic filter is easily modified into a low or high-pass filter. In FIG. 5, for example, the filter acts as a low-pass filter if the utilization device 14 connects to the output of amplifier 58, rather than the amplifier 64. At high frequencies, the capacitor 54 shorts and grounds the input so there is no output. An analysis of the circuit also shows that the transfer function is:

$$\frac{-R66/R68}{(A+1)T1T2s^2+[(A+1)T1+T2]s+(A+1)} \quad (27)$$

The numerator has no "$s^2$" or "s" term, which is characteristic of a low-pass filter. That is, equation (1) applies when $a=b=o$.

Another modification produces a high-pass filter. In this case, the circuit in FIG. 4 is modified by eliminating the resistor 66 and connecting the utilization device 14 to the output of the amplifier 58. At low frequencies, the capacitor 54 blocks all signals. At high frequencies, the gain of amplifier 64 is reduced to unity gain thereby minimizing feedback. Similarly, the generalized transfer function describes the filter operation of $b=c=0$ so there is an "$s^2$" term in the numerator. This is characteristic of a high-pass filter function.

Figure 10:
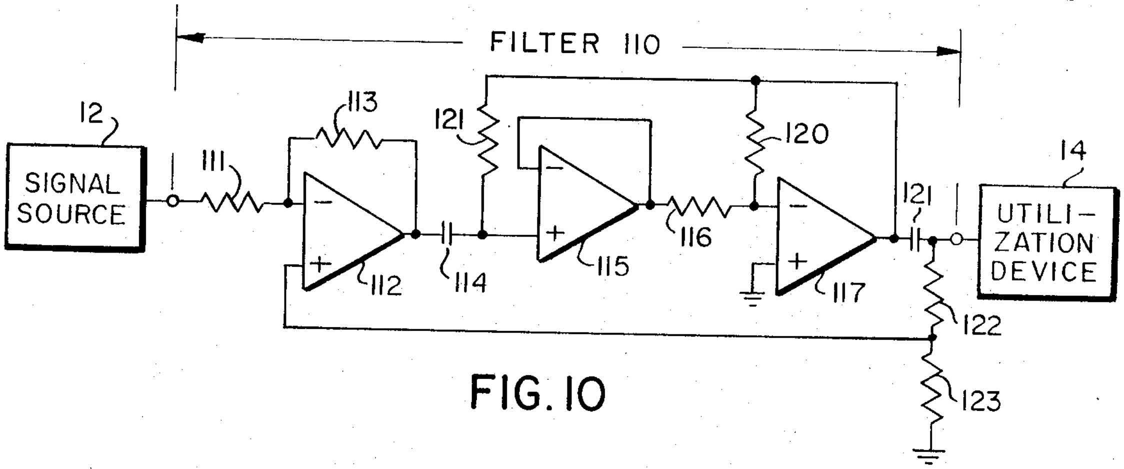
FIG. 10 is a high-pass filter constructed in accordance with my invention.

FIG. 10 is another example of a high-pass filter. This circuit 110 comprises a resistor 111 which couples a signal from the signal device 12 as one component to the inverting input of a summing amplifier 112. A resistor 113 provides negative feedback. The output of the amplifier 112 is coupled through a capaciotr 114 to a unity gain amplifier 115. Another resistor 116 couples the output from the amplifier 115 to the inverting input of an amplifier 117. A first resistor 120 provides negative feedback for the amplifier 117; a second resistor 121 provides negative feedback to the non-inverting input of the amplifier 115. The utilization device 14 receives an output signal through a time constant network comprising capacitor 121 and series resistors 122 and 123, which also provide an attentuated output signal as a negative feedback signal which is a second input component to the summing amplifier 112.

At low frequencies, the capacitors 114 and 121 assume a high impedance and effectively disconnect the filter circuit so no signal reaches utilization device 14. However, at high frequencies, these capacitors assume a low impedance, so an output signal exists. The transfer function for this circuit is:

$$e_o/e_{in}=-AT1T2s^2/(A+1)T1T2s^2+[(A+1)T1+T2]s+(A+1) \quad (28)$$

and resistors 111, 113 122, and 123 must satisfy the condition R113/R111 = R123/R122 . Hence, the basic filter acts as a high-pass or low-pass filter and the transfer functions are identical except for the modification to the numerator.

Figure 11:
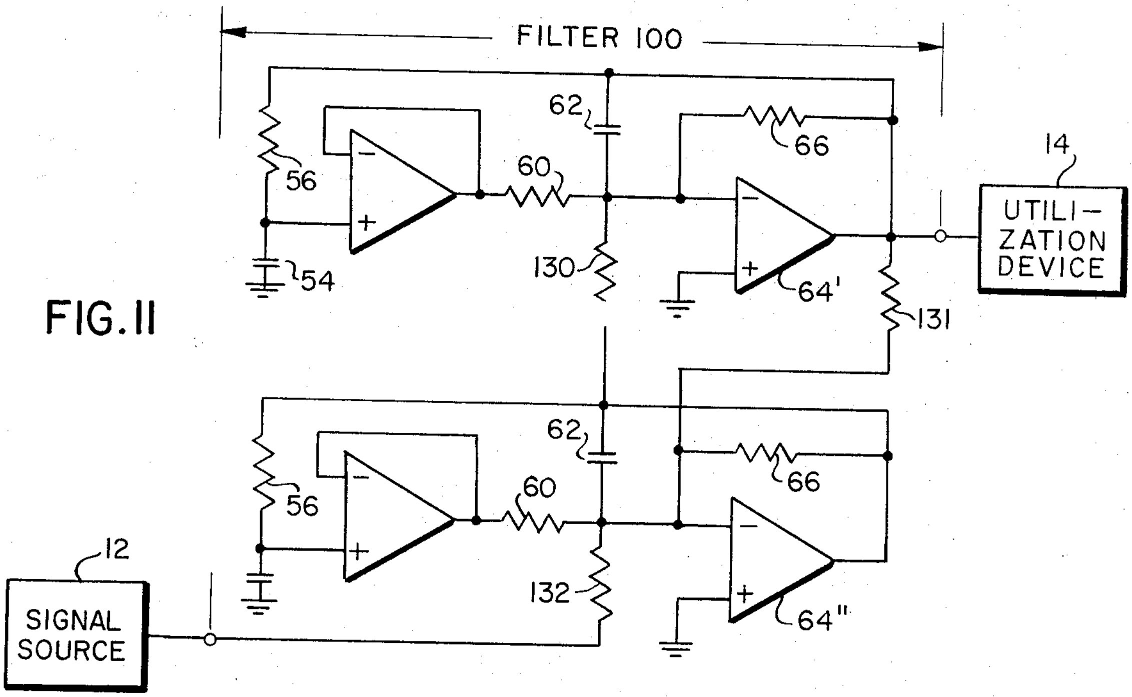
FIG. 11 is a coupled filter circuit constructed in accordance with my invention.

Two filters similar to the filters shown in FIG. 5 can be cross connected in FIG. 11 to produce the characteristic "flat top" response of a coupled circuit. The characteristic curve has a flat response over a fairly wide frequency range and then drops rapidly with steep skirts. A coupling resistor 130 couples a common feedback point of one to the summing point (inverting input) of the amplifier 64'. Cross coupling is completed by a resistor 131 which connects the output from the amplifier 64' to the inverting input of the amplifier 64''. The signal device 12 applies a signal through a resistor 132 to the summing junction of the amplifier 64''. If the resistor 131 is omitted from the circuit, the circuit response is the product of the individual filter circuit response.

Resistor 131 provides a positive feedback path. The resulting positive feedback enhances the overall selectivity in a manner similar to that discussed with respect to FIG. 7. If the upper filter circuit has a response G', and the lower filter circuit has a response G'', then the overall response of the filter circuit is:

$$G=G'G''/1-G'G''\beta \quad (29)$$

where $\beta$ is a feedback factor proportional to the reciprocal of the resistor 131. Hence, changes to resistor 131 alter selectivity without affecting the resonant frequency.

In all the preceding filters the quality factor is insensitive to changes in the values of individual elements in the filter at a specific value of quality factor. If positive feedback is added, this insensitivity exists for only a specific value of $\beta$ as $\beta$ determines the quality factor. The filter in FIG. 11 eliminates this constraint. That is, if the two component filters are individually insensitive, the value of the resistor 131 can be changed to thereby alter the overall quality factor for the system. However, these changes do not affect this insensitivity characteristic. This is a distinct advantage over the preceding circuits.

In summary, each described embodiment satisfies the generalized transfer function and filters it describes are very flexible. Furthermore, circuit changes produce predictable operational changes. For example, in the different band-pass filter embodiments changing the input points predictably alter the input impedance and, to a degree, the quality factor. However, the resonant frequency remains the same. Specific band-pass filters constructed in accordance with my invention have mutually independent quality factor and resonant frequency control. This characteristic is also found in the oscillator and notch filters. In others, the bandwidth or gain at resonance can be varied without affecting the resonant frequency.

From the foregoing discussion, it is obvious that modifications can be made to the disclosed filters and still obtain a filter which operates substantially in accordance with the transfer function of equation (1), especially for high quality factors. Therefore, it is an object of the appended claims to cover all such variations and modifications as come within the true spirit and scope of this invention.

What I claim as new and desire to secure by Letters Patent of the United States is:

1. A filter circuit comprising:

A. amplifier means with input and output connections

B. first and second time constant networks, each network including a first and second impedance element in series and having first and second end connections, C. unity gain isolating means with an output coupled to said amplifier means input connection D. a first negative feedback path for said amplifier including said impedance element connected to the first end connection in said first time constant network and said isolating means and, E. a second negative feedback path for said amplifier including said impedance element connected to the first end connection in said second time constant network, said second feedback path being isolated from said first feedback path, said second end connections of said first and second time constant networks being terminated in zero impedance connection to ground.

2. A filter circuit as recited in claim 1 wherein said first and second time constant networks have time constants $T_L$ and $T_H$ respectively, said filter having input and output terminal means and having the transfer function $$e_{out}/e_{in}=f(s)/(A+1)\ T_LT_HS^2+[(A+1)T_H+T_L]s+(A+1)$$

wherein $e_{out}$ is the filter output voltage at said output terminal means, $e_{in}$ is the filter input voltage at said input terminal means, $f(s)$ is a function of "s" and "s"

is the operator $j\omega$, $\omega$ being the operating angular frequency for said filter circuit.

3. A filter as recited in claim 2 wherein said input terminal means connect to said first time constant network and said output terminal means connect to said amplifier output connection, said filter constituting a band-pass filter.

4. A filter as recited in claim 3 wherein the filter connections provide $f(s) = -AT_Ls$.

5. A filter as recited in claim 4 wherein said first and second time constant networks each comprise a resistor and capacitor, said first time constant network resistor being connected to said input terminal means and said capacitor being connected in said first feedback path, said second time constant network resistor being connected in said second feedback path and capacitor coupling a signal from said isolating means to said amplifier input connection, said amplifier output connection being connected to said output terminal means.

6. A filter as recited in claim 4 wherein said first time constant network comprises a capacitor coupled to said input terminal means and a resistor connected in said first feedback path and said second time constant network comprises a resistor for coupling signals from said isolating means to said amplifier input connection and a capacitor connect in said second feedback path.

7. A filter circuit as recited in claim 4 wherein said amplifier means additionally includes positive feedback means.

8. A filter as recited in claim 4 wherein said amplifier means includes first and second amplifiers having first and second gains, said amplifiers being cascaded and said utilization device being connected to an input terminal of said second amplifier, said amplifiers having opposite polarity.

9. A filter as recited in claim 4 additionally comprising a summing amplifier and means for summing the filter output with said signal, said summing amplifier combining the filter and non-filtered signals.

10. A filter system comprising first and second filters, each of said first and second filters including a filter as recited in claim 4, said filter system additionally comprising means for coupling said amplifier output connection in said second filter to said amplifier input connection in said first filter and means for coupling said amplifier output connection of said first filter to said amplifier input connection in said second filter.

11. A filter as recited in claim 2 wherein said input terminal means connects to said amplifier and said output terminal means connects to said amplifier output connector.

12. A filter as recited in claim 11 wherein said first time constant network comprises a resistor and capacitor connected in series to form a voltage divider, said resistor being in said first feedback path, and said second time constant network comprises a resistor connected to said isolating means for coupling the voltage across said first time constant network capacitor to said amplifier means and a capacitor connected in said second feedback path, said amplifier means additionally including a third negative feedback path, one of said input connections summing all the feedback signals.

13. A filter circuit as recited in claim 12 wherein said amplifier means has inverting and non-inverting input connections, said third feedback path connecting to said inverting input connection and another resistor connects said input terminal to said amplifier inverting input connection.

14. A filter circuit as recited in claim 11 wherein said amplifier means includes inverting and non-inverting input connections, said third negative feedback path connecting to said inverting input connection, said input terminal being connected to said non-inverting input connection.

* * * * *

UNITED STATES PATENT OFFICE
CERTIFICATE OF CORRECTION

Patent No. 3,789,313 Dated January 29, 1974

Inventor(s) Albert E. Sanderson

It is certified that error appears in the above-identified patent and that said Letters Patent are hereby corrected as shown below:

In the Abstract, the equation at lines 4 and 5 "$as^2+bs+c$" should be --$(as^2+bs+c)$--
Col. 2, line 16, "$as^2+bs+c$" should be --$(as^2+bs+c)$--
line 57, "$as^2+bs+c$" should be --$(as^2+bs+c)$--
Col. 8, line 33, "[(A+1)T2+1]" should be --[(A+1)T2+T1]--
Col. 9, line 59 "$\lambda$" should be deleted
Col. 10, line 46, the equation should be
--$e_o/e_{in}=\{R104/R100\}\{AT2s/(A+1)T1T2s^2+[(A+1)T2+T1]s+(A+1)\}-\{R104/R102\}$--
line 57, "-R66/R68" should be --(-R66/R68)--
Col. 12, line 42, "a" should be deleted
Col. 14, line 1, "filter" should be --filtered--

Signed and sealed this 18th day of February 1975.

(SEAL)
Attest:

RUTH C. MASON
Attesting Officer

C. MARSHALL DANN
Commissioner of Patents
and Trademarks